(12) United States Patent
Volkovich et al.

(10) Patent No.: US 11,644,419 B2
(45) Date of Patent: May 9, 2023

(54) MEASUREMENT OF PROPERTIES OF PATTERNED PHOTORESIST

(71) Applicant: KLA Corporation, Milpitas, CA (US)

(72) Inventors: Roie Volkovich, Hadera (IL); Liran Yerushalmi, Zicron Yaacob (IL); Amnon Manassen, Haifa (IL); Yoram Uziel, Yodfat (IL)

(73) Assignee: KLA Corporation, Milpitas, CA (US)

( * ) Notice: Subject to any disclaimer, the term of this patent is extended or adjusted under 35 U.S.C. 154(b) by 114 days.

(21) Appl. No.: 17/160,547

(22) Filed: Jan. 28, 2021

(65) Prior Publication Data

US 2022/0236181 A1 Jul. 28, 2022

(51) Int. Cl.
| | |
|---|---|
| *G01N 21/41* | (2006.01) |
| *G01N 21/3563* | (2014.01) |
| *G01N 21/956* | (2006.01) |
| *G01B 9/02* | (2022.01) |
| *G01N 21/45* | (2006.01) |
| *G01N 21/25* | (2006.01) |

(52) U.S. Cl.
CPC ........... *G01N 21/4133* (2013.01); *G01B 9/02* (2013.01); *G01N 21/25* (2013.01); *G01N 21/3563* (2013.01); *G01N 21/45* (2013.01); *G01N 21/956* (2013.01); *G01N 2021/3568* (2013.01)

(58) Field of Classification Search
CPC .............. G01N 21/4133; G01N 21/25; G01N 21/3563; G01N 21/45; G01N 21/956; G01N 2021/3568; G01B 9/02
See application file for complete search history.

(56) References Cited

U.S. PATENT DOCUMENTS

| | | | |
|---|---|---|---|
| 7,609,388 B2 | 10/2009 | Arieli et al. | |
| 7,928,390 B1 | 4/2011 | Zhuang et al. | |
| 8,982,358 B2 | 3/2015 | Shchegrov et al. | |
| 9,250,178 B2 | 2/2016 | Chuang et al. | |
| 9,347,872 B1 | 5/2016 | Poslavsky et al. | |
| 9,413,134 B2 | 8/2016 | Dribinski et al. | |
| 10,185,303 B2 | 1/2019 | Veldman | |
| 10,502,692 B2 | 12/2019 | Cao et al. | |
| 2012/0050739 A1* | 3/2012 | Hayano | H01L 22/12 356/369 |

(Continued)

FOREIGN PATENT DOCUMENTS

| | | |
|---|---|---|
| KR | 20110064649 A | 6/2011 |
| KR | 20120081419 A | 7/2012 |
| WO | 2016024117 A1 | 2/2016 |

OTHER PUBLICATIONS

WIPO, ISR for International Application No. PCT/US2021/016495, dated Oct. 7, 2021.

(Continued)

*Primary Examiner* — David P Porta
*Assistant Examiner* — Gisselle M Gutierrez
(74) *Attorney, Agent, or Firm* — Hodgson Russ LLP

(57) ABSTRACT

A method for optical inspection includes illuminating a patterned polymer layer on a semiconductor wafer with optical radiation over a range of infrared wavelengths, measuring spectral properties of the optical radiation reflected from multiple points on the patterned polymer layer over the range of infrared wavelengths, and based on the measured spectral properties, computing a complex refractive index of the patterned polymer layer.

18 Claims, 3 Drawing Sheets

(56) References Cited

U.S. PATENT DOCUMENTS

| | | | |
|---|---|---|---|
| 2012/0176623 A1* | 7/2012 | Lee | G01B 11/0675 |
| | | | 356/503 |
| 2015/0043006 A1 | 2/2015 | de Groot | |
| 2019/0094653 A1 | 3/2019 | Patil et al. | |
| 2020/0225151 A1 | 7/2020 | Wang et al. | |
| 2020/0240907 A1 | 7/2020 | Wang et al. | |
| 2020/0393373 A1 | 12/2020 | Immer et al. | |

OTHER PUBLICATIONS

Thakur et al., "Stability studies on a sensitive EUV photoresist based on zinc metal oxoclusters," Journal of Micro/Nanolithography, MEMS, and MOEMS, 2019, vol. 18, No. 4, 043504-1 to 043504-10.

* cited by examiner

MEASUREMENT OF PROPERTIES OF PATTERNED PHOTORESIST

FIELD OF THE INVENTION

The present invention relates generally to manufacture of semiconductor circuits, and particularly to apparatus and methods for semiconductor circuit metrology.

BACKGROUND

Semiconductor circuits are manufactured using photolithographic methods (photolithography). In photolithography, a thin layer of a photosensitive polymer (photoresist) is deposited over a semiconductor wafer and patterned using optical or other radiation, leaving parts of the wafer covered by the photoresist. After patterning, the wafer is modified by methods such as etching or ion bombardment to change the material properties or the geometry of the wafer, while the parts of the wafer covered by the photoresist are not affected. Semiconductor circuit metrology is commonly used for measuring properties of the patterned photoresist, such as the geometry and location of the patterned features.

SUMMARY

Embodiments of the present invention that are described hereinbelow provide improved apparatus and methods for semiconductor circuit metrology.

There is therefore provided, in accordance with an embodiment of the present invention, a method for optical inspection, which includes illuminating a patterned polymer layer on a semiconductor wafer with optical radiation over a range of infrared wavelengths, measuring spectral properties of the optical radiation reflected from multiple points on the patterned polymer layer over the range of infrared wavelengths, and, based on the measured spectral properties, computing a complex refractive index of the patterned polymer layer.

In a disclosed embodiment, measuring the spectral properties includes recording interferometric signals from the multiple points on the patterned polymer layer. Additionally, measuring the spectral properties includes computing a reflectance spectrum of each of the multiple points on the patterned polymer layer by applying a Fourier transform to the recorded interferometric signals.

In another embodiment, computing the complex refractive index includes computing a reference library of computed reflectance spectra using multiple values of the complex refractive index and properties of the patterned polymer layer and the semiconductor wafer, selecting from the reference library a computed reflectance spectrum that best matches the measured spectral properties, and assigning to the patterned polymer layer the complex refractive index of the selected computed spectrum.

In another embodiment, computing the reference library includes computing the reflectance spectra using an optical thin-film computational model. For example, the optical thin-film computational model may be one used with OCD products belonging to KLA Corporation of Milpitas, Calif. Reflectance spectra can be computed from a model by extracting a spectra from a library.

In yet another embodiment, selecting the computed reference spectrum includes computing a root-mean square difference between the measured spectral properties and each of the computed reflectance spectra.

In a disclosed embodiment, computing the complex refractive index includes computing the complex refractive index of the patterned polymer layer at each of the multiple points on the patterned polymer layer, and computing an average and a standard deviation of the computed complex refractive index over the multiple points.

In a further embodiment, the polymer layer includes a photoresist.

In another embodiment, measuring the spectral properties includes capturing overlay images including the patterned polymer layer, and extracting the spectral properties from the overlay images.

There is also provided, in accordance with an embodiment of the present invention, an optical inspection apparatus, which includes an illumination assembly, configured to illuminate a patterned polymer layer on a semiconductor wafer with optical radiation over a range of infrared wavelengths, a detector array, an imaging assembly configured to image the optical radiation reflected from multiple points on the patterned polymer layer onto the detector array, and a controller configured to read out and process signals from the detector array in response to the reflected radiation so as to measure spectral properties of the radiation reflected from the multiple points, and based on the measured spectral properties, to compute a complex refractive index of the patterned polymer layer.

The present invention will be more fully understood from the following detailed description of the embodiments thereof, taken together with the drawings in which:

DETAILED DESCRIPTION OF EMBODIMENTS

Figure 1:
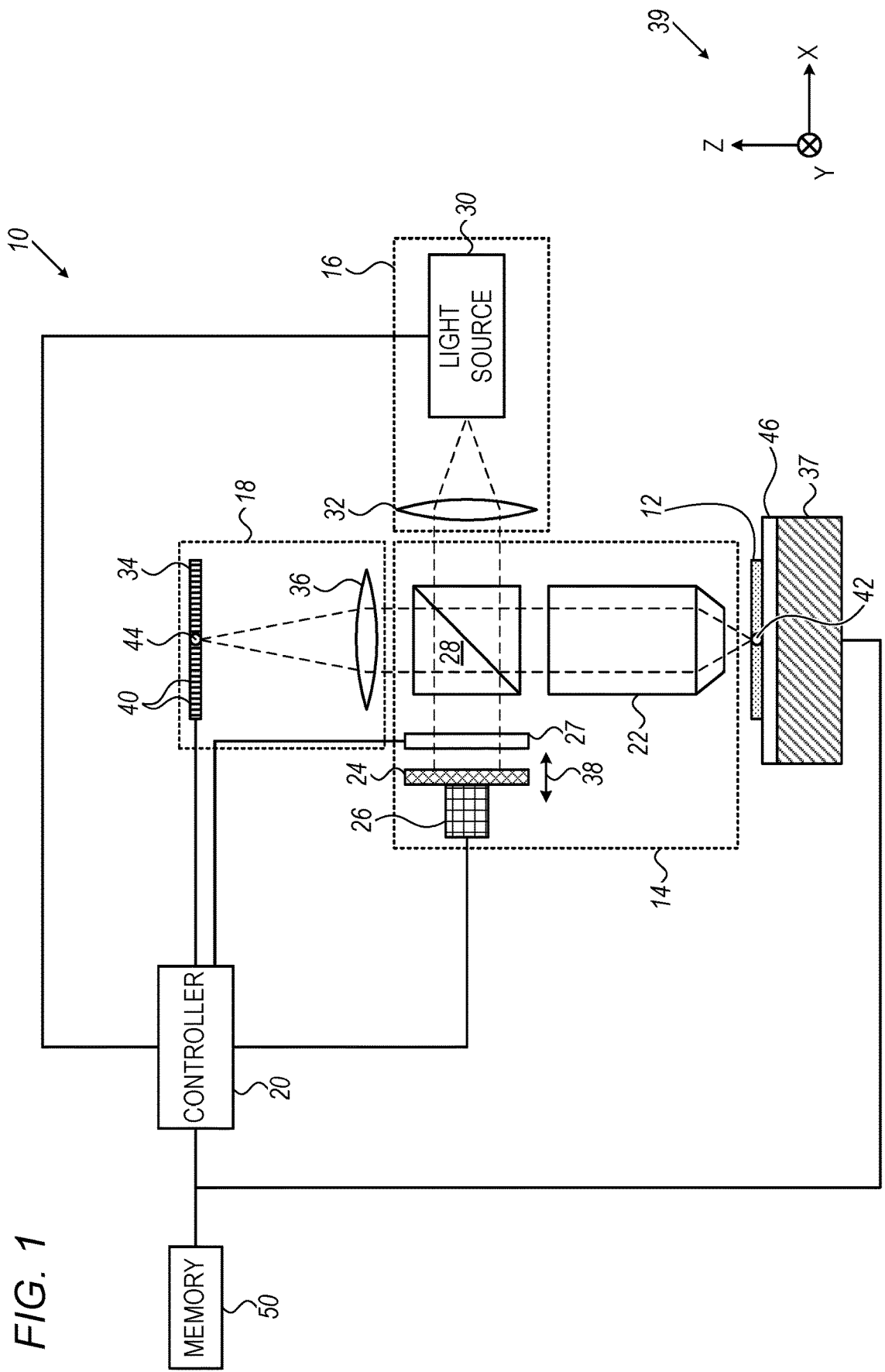
FIG. 1 is a schematic pictorial illustration of an optical inspection apparatus for measuring a complex refractive index of a patterned photoresist, in accordance with an embodiment of the invention.

The advances in the performance of electronic devices are powered by semiconductor circuits with ever-smaller features. Currently-produced leading-edge semiconductor circuits comprise features with linewidths of 5 nm, and these linewidths are predicted to continue to shrink. A key technology enabling the current feature sizes and their continued shrinking is photolithography, wherein ever-smaller features are patterned in photoresist. An important concept in photolithography is the so-called process window, which describes the allowable variabilities of photolithographic parameters (for example, the focus of the exposure tool) that still permit achieving the required feature sizes.

One of the requirements for a manageable process window is the ability to control the uniformity of the photoresist material in terms of its chemical and optical properties. Real-time metrology of the chemical and optical properties of the photoresist is useful in detecting variations in these properties, which might otherwise narrow the process window and reduce the process yield.

The embodiments of the present invention that are described herein address this problem by providing a method of optical inspection for measuring the complex refractive index of a patterned polymer, such as a photoresist. The complex refractive index provides a useful measure of the quality and uniformity of the photoresist but is usually measured after the photoresist has been patterned. The method comprises illuminating the patterned photoresist on the semiconductor wafer with optical radiation over a range of infrared (IR) wavelengths. The spectral properties of the optical radiation reflected from the patterned polymer layer over the range of infrared wavelengths are measured using an optical inspection apparatus, and, based on the measured spectral properties, the complex refractive index of the patterned photoresist is computed. The terms "optical rays," "optical radiation," "light," and "beams of radiation" as used in the present description and in the claims, refer generally to any and all of visible, infrared, and ultraviolet radiation. The terms "measure" and "measurement" refer to both measurement and for a combination of measurement and computation, depending on the context, whereas the terms "compute" and "computation" are used only in the context of computing.

In a disclosed embodiment, an optical inspection apparatus functions as an optical interferometer. A beam of broadband IR radiation is projected from an IR light source into the interferometer. The interferometer divides the beam into two parts, wherein one part is directed to the main arm of the interferometer to illuminate the photoresist, and the other part is directed to a mirror in the reference arm (reference mirror) of the interferometer. The part of the radiation reflected from the photoresist and the part reflected by the reference mirror are combined by the interferometer to interfere with one another and projected onto a detector array. Imaging optics in the apparatus image the patterned photoresist onto the detector array.

During the measurement, the difference in optical path between the main and reference arms is varied by moving the reference mirror. Varying the optical path difference causes the optical intensity on the detector array to oscillate at each pixel of the detector array, wherein the shape of the oscillating intensity for a given pixel is determined by the complex reflectance of the photoresist imaged to that pixel and by the spectrum of the illuminating radiation.

Applying the method of Fourier Transform Infrared (FTIR) spectroscopy, the spectrum of the optical radiation reflected by the photoresist is computed based on the Fourier transform of the oscillating intensity signal. The complex refractive index of the patterned photoresist is extracted from the measured spectrum, for example by comparing the measured spectrum to a library of reference spectra that have been measured and/or computed for photoresists having known values of complex refractive index and thickness of the photoresist, taking into account the properties of the semiconductor stack underlying the photoresist.

DESCRIPTION OF OPTICAL INSPECTION APPARATUS

FIG. 1 is a schematic pictorial illustration of an optical inspection apparatus 10 for measuring a complex refractive index of a patterned photoresist 12 on a semiconductor wafer 46, in accordance with an embodiment of the invention.

Optical inspection apparatus 10 comprises an interferometer 14, an illumination assembly 16, an imaging assembly 18, a controller 20, and a table 37, on which wafer 46 is mounted. Interferometer 14 comprises an objective lens 22 as the main arm of the interferometer, a reference mirror 24 with a linear actuator 26 and a shutter 27 as the reference arm of the interferometer, and a cube beamsplitter 28 at the juncture of the two arms. When shutter 27 is open, optical radiation can propagate between cube beamsplitter 28 and reference mirror 24, whereas closing the shutter isolates the reference mirror optically from the rest of the optics. Illumination assembly 16 comprises an IR light source 30 and a lens 32. Light source 30 may emit, under control of controller 20, either a broad spectrum of IR light or a narrow-band spectrum that is tunable either continuously or through discrete wavelengths. Imaging assembly 18 comprises a detector array 34 and a lens 36. Table 37 is located in proximity to objective lens 22, and comprises actuators, controlled by controller 20, which can move the table linearly in x-, y-, and z-directions (with reference to Cartesian coordinates 39), as well as rotate the table around the z-axis.

In the pictured embodiment, photoresist 12 has been deposited over semiconductor wafer 46 and patterned in a photolithographic process. Wafer 46 is positioned on table 37 so that the combined optics of objective lens 22 and lens 36 image photoresist 12 onto detector array 34, i.e., the photoresist and the detector array are located at optical conjugate planes.

Controller 20 is coupled to linear actuator 26, to detector array 34, to shutter 27, to light source 30, and to table 37. Linear actuator 26 comprises, for example, a piezoelectric translator (PZT). In this case, controller 20 applies a voltage to linear actuator 26, thus causing reference mirror 24 to move in the x-direction towards or away from cube beamsplitter 28, as indicated by an arrow 38. Detector array 34 comprises, for example, a complementary metal-oxide-semiconductor (CMOS) detector with a two-dimensional array of pixels 40. As photoresist 12 and detector array 34 are located in conjugate planes, each pixel 40 receives optical radiation reflected from a conjugate point on the photoresist. Thus, for example, a point 42 on photoresist 12 is imaged onto a pixel 44 on detector array 34. Controller 20 reads out from each pixel 40 a signal proportional to the optical intensity received by the pixel.

Two kinds of images of photoresist 12 may be projected onto detector array 34: Interferometric images and non-interferometric (or bright-field) images.

To capture an interferometric image, light source 30 projects a beam of optical radiation to lens 32, which further projects the beam to cube beamsplitter 28. Beamsplitter 28 splits the received beam into two beams: One beam is reflected by beamsplitter 28 into objective lens 22, which projects the beam onto photoresist 12; and the other beam is transmitted by the beamsplitter to reference mirror 24. The radiation impinging on photoresist 12 is reflected back to objective lens 22 and passed on to beamsplitter 28, which transmits the radiation to lens 36. The radiation impinging on reference mirror 24 is reflected back to beamsplitter 28, and further reflected to lens 36. Thus, lens 36 receives beams of radiation reflected by both photoresist 12 and by reference mirror 24. These beams are focused by lens 36 onto detector array 34, and each pixel 40 of the detector records the interference signal from a respective point on photoresist 12 that is conjugate to the pixel. The interference signal is a sum of the optical fields of the two beams, taking into account both the amplitude of each beam and the relative phase between the beams. The signals from pixels 40 are read out from the detector by controller 20.

To capture a non-interferometric (bright-field) image, controller 20 closes shutter 27. In this case the beam of optical radiation projected by light source 30 passes only through the main arm of interferometer 14 and is reflected only by photoresist 12 and projected onto detector array 34.

Controller 20 typically comprises a programmable processor, which is programmed in software and/or firmware to carry out the functions that are described herein, along with suitable digital and/or analog interfaces for connection to the other elements of apparatus 10. Alternatively or additionally, controller 20 comprises hard-wired and/or programmable hardware logic circuits, which carry out at least some of the functions of the controller. Although controller 20 is shown in FIG. 1, for the sake of simplicity, as a single, monolithic functional block, in practice the controller may comprise multiple, interconnected control units, with suitable interfaces for receiving and outputting the signals that are illustrated in the figures and are described in the text.

Controller 20 is connected to a memory 50, which contains a library of reference information with respect to measured and/or computed optical properties of photoresists having known values of complex refractive index and thickness of the photoresist. For example, the reference information may comprise infrared spectra of photoresist layers of different compositions and/or different physical properties. These spectra may also take into account the properties of the layers on wafer 46 underlying the photoresist. Memory 50 may be connected locally to controller 20, as shown in FIG. 1. Additionally or alternatively, controller 20 may access a remote library, over a network, for example.

Measuring Complex Refractive Index of Patterned Photoresist

As noted earlier, variabilities in the properties of patterned photoresist 12, such as its chemical composition, may affect the available process window of the photolithographic process and the quality of the photoresist pattern. Monitoring these properties enables tighter control of the photolithographic process.

One indicator of the variability of the properties of photoresist 12 is the variability of its complex refractive index n around its nominal value. Complex refractive index n of the photoresist may be written as the complex quantity $\tilde{n}=n+ik$, wherein the real part n is the ratio between the speed of light in vacuum and the speed of light in the photoresist (relevant, for example, for the refraction of light in the resist), and the imaginary part k indicates the attenuation of light within the resist. Apparatus 10 is capable of measuring the complex refractive index of photoresist 12 using one or more of a number of different techniques, including interferometric measurement of the reflectance spectrum of the photoresist and processing overlay images of the photoresist. These techniques are described in greater detail hereinbelow.

Figure 2:
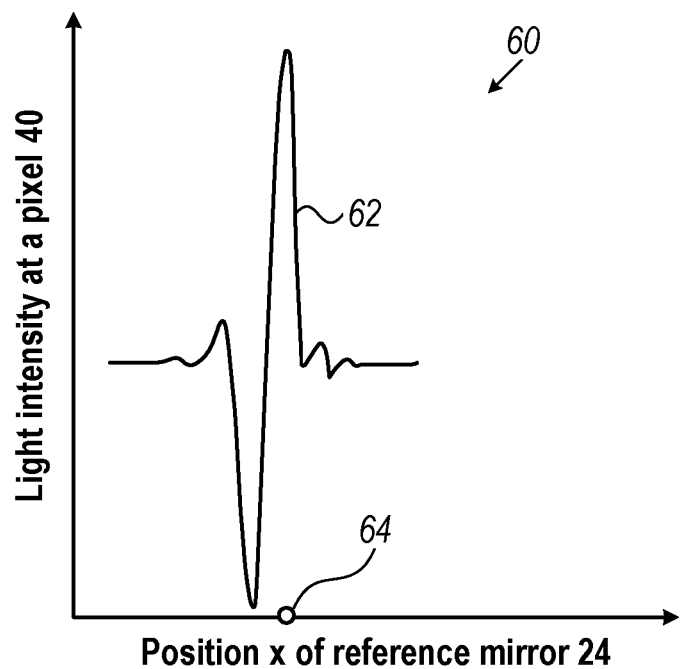
FIG. 2 is a plot of an interferometric signal from a patterned photoresist at a given pixel of a detector array, in accordance with an embodiment of the invention.

FIG. 2 is a plot 60 of an interferometric signal (illustrated by curve 62) from photoresist 12 at a given pixel 40 of detector array 34, in accordance with an embodiment of the invention.

For producing the interferometric signal shown by curve 62 using apparatus 10, controller 20 commands actuator 26 to move reference mirror 24 in the direction of arrow 38. For each position of mirror 24, controller 20 reads from detector array 34 the respective signals from pixels 40. Actuator 26 may move reference mirror 24 either in discrete steps or in a continuous manner, with controller 20 reading the signals from detector array 34 either in synchronization with the discrete steps or at points in time determined by the controller.

Curve 62 shows the intensity of the optical radiation impinging on a given pixel 40, as a function of position x of reference mirror 24 as it is moved by actuator 26. Curve 62 is an oscillating curve, with the period of the oscillations corresponding to a movement of reference mirror 24 by a half of the average wavelength of the broadband optical radiation illuminating photoresist 12. The oscillations have a maximum amplitude at a position 64 of reference mirror, corresponding to equal optical paths between the main and reference arms of interferometer 14. The oscillations of curve 62 decay away from position 64 due to the bandwidth of the broadband optical radiation.

Figure 3:
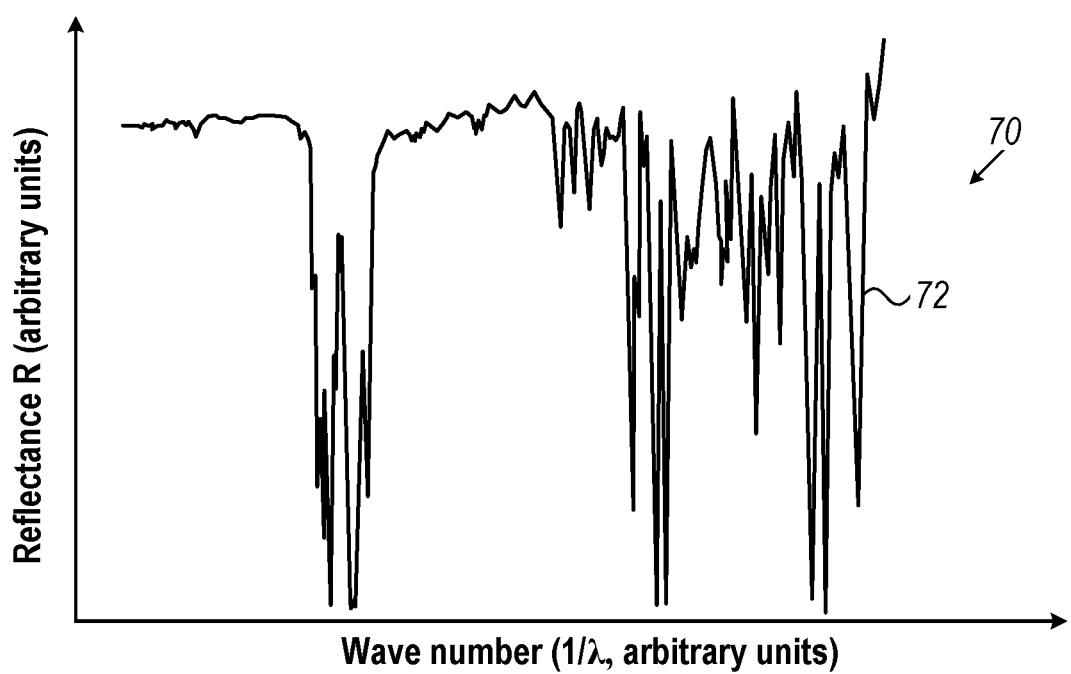
FIG. 3 is a plot of a reflectance spectrum of a patterned photoresist, in accordance with an embodiment of the invention.

FIG. 3 is a plot 70 of the reflectance spectrum of photoresist 12 at pixel 40, in accordance with an embodiment of the invention. A curve 72 in plot 70 shows the reflectance of photoresist 12 as a function of wavenumber (inverse of wavelength k). The reflectance spectrum has been obtained by applying a discrete Fourier transform to the interferometric signal (curve 62) shown in plot 60 by. This approach is known as FTIR spectroscopy. Controller 20 measures spectra of this sort at multiple pixels 40 over a region of interest on wafer 46 (which may extend over the entire wafer). The spectra will typically vary from pixel to pixel as a function of the local composition, quality, and patterning of photoresist 12.

Figure 4:
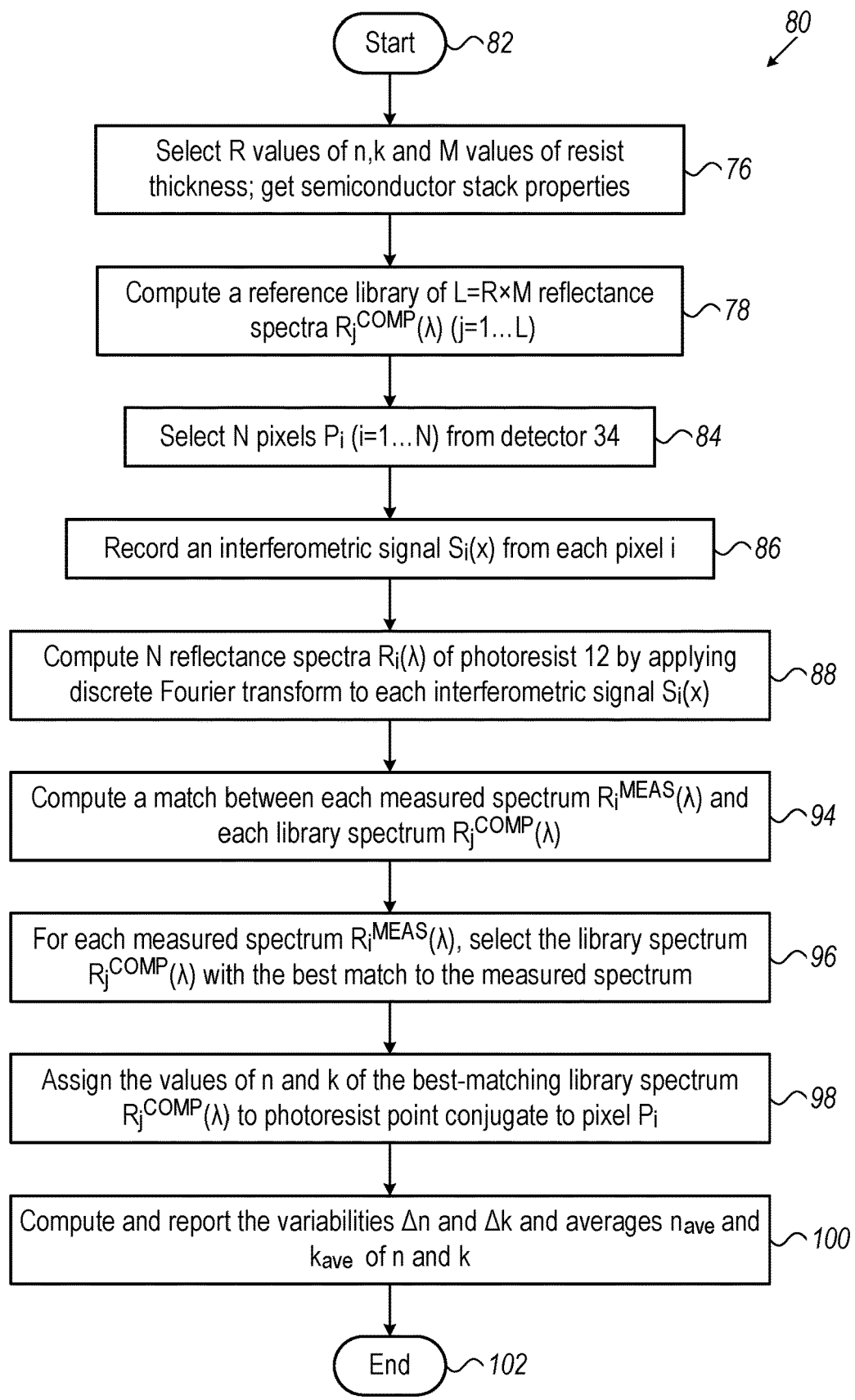
FIG. 4 is a flowchart that schematically illustrates a process for measuring the complex refractive index ñ of a patterned photoresist, in accordance with an embodiment of the invention.

FIG. 4 is a flowchart 80 that schematically illustrates a process for measuring the complex refractive index n of patterned photoresist 12 based on the FTIR spectra, in accordance with an embodiment of the invention.

The method begins at a start step 74. Prior to measuring the reflectance spectra, a library of reference reflectance spectra is computed to form a reference library. The reference spectra are typically selected from a compendium of spectra that have been measured and/or computed previously and are stored in memory 50. For this purpose, in a parameter selection step 76, a set of R pairs $n_r, k_r$ (r=1 ... R) of the real and imaginary parts of the complex refractive index $\tilde{n}$ of photoresist 12 are selected. These values are commonly selected around their nominal values for photoresist 12. Nominal refractive index values for a photoresist can be from 1.55 to 1.85, though other values are possible. Nominal extinction coefficients for a photoresist can be from 0 to 0.05 or from greater than 0 to 0.05, though other values are possible. In addition, M values $t_m$ (m=1 ... M) for the thickness of photoresist 12 are selected around the nominal thickness of the resist. Nominal M values can be from 20 nm to approximately 100 nm, though other values are possible. The thicknesses and complex refractive indices of the layers of the semiconductor stack under the photoresist can be selected by the operator of apparatus 10, depending on the relevant process parameters, or they may be preselected and stored in memory 50 as the reference library for subsequent reference.

On the basis of the stored spectra, controller 20 computes a library of L=R×M reflectance spectra ("library spectra"), $R_j^{COMP}(\lambda)$ (j=1 ... L), in a library computation step 78, for the L combinations of complex refractive index n and thickness of resist 12. The computations are performed for the L combinations on the known semiconductor stack using thin-film calculation methods and computational tools that are known in the art.

When the library is ready, the actual measurement process can begin. In a pixel selection step 84, controller 20 (FIG. 1)

selects from detector array 34 a set of N pixels 40 {$P_i$} (i=1 ... N), wherein each pixel $P_i$ corresponds to a point in patterned photoresist 12. Controller 20 selects pixels $P_i$ either automatically, utilizing a suitable image processing algorithm, or under control of input from an operator of apparatus 10, or through a combination of image processing and operator inputs.

In a scan step 86, controller 20 moves reference mirror 24 through a range in x and collects N interferometric signals $S_i(x)$ from the respective pixels $P_i$ in detector array 34. Here x refers to the position of reference mirror 24. An example of an interferometric signal is given by curve 62 in FIG. 2. In a Fourier transform step 88, controller 20 applies a discrete Fourier transform to each of signals $S_i(x)$, thus producing N measured reflectance spectra $R_i^{MEAS}(\lambda)$. An example of such a reflectance spectrum is given by curve 72 in FIG. 3.

In a matching step 94, controller 20 computes a match between each of the measured reflectance spectra $R_i^{MEAS}(\lambda)$ (i=1 ... N) (computed in Fourier transform step 88) and the library of reflectance spectra $R_j^{COMP}(\lambda)$ (j=1 ... L) (computed in library computation step 78) for each of the pixels in {$P_i$}. The match may be computed, for example, as a root-mean square (RMS) difference between each pair $R_i(\lambda)$ and $R_j^{COMP}(\lambda)$, with the integration for the RMS taken across the spectrum. In a selection step 96, controller 20 selects for each measured spectrum $R_i^{MEAS}(\lambda)$ the library spectrum $R_j^{COMP}(\lambda)$ with the best match (smallest RMS). In an assignment step 98, controller 20 assigns the values $n_j$ and $k_j$ associated with the best-matching library spectrum $R_j^{COMP}(\lambda)$ to location i in photoresist 12 as the real and imaginary parts of the complex refractive index, respectively $n_i$ and $k_i$, of this location. In a variability and average step 100, controller 20 computes and reports the variabilities $\Delta n$ and $\Delta k$ (for example, standard deviations) and the averages $n_{ave}$ and $k_{ave}$ of the values of $n_i$ and $k_i$ across the N points $P_i$ (i=1 ... N) on photoresist 12. The process ends in an end step 102.

In an alternative embodiment, the complex refractive index of patterned photoresist 12 is measured by processing overlay images of the photoresist, for example images captured by apparatus 10. Overlay images are typically bright-field images (as explained above with reference to FIG. 1) of overlay targets on wafer 46. An overlay target comprises features of both patterned photoresist 12 and reference features located in an underlying patterned process layer. Overlay targets are generally used in apparatus 10 to measure a lateral shift (in the x- and y-directions) of features of patterned resist 12 relative to the reference features in the underlying process layer. In the present embodiment, however, the overlay images are used in deriving spectral properties for use in finding the complex refractive index.

Prior to measuring the overlay images, a library of reference overlay images is computed. The reference overlay images are typically selected by controller 20 from a compendium of overlay images that have been measured and/or computed previously and are stored in memory 50. For this purpose, similarly to parameter selection step 76 in FIG. 4, a set of pairs of the real and imaginary parts of the complex refractive index n of photoresist 12, as well as a set of resist thicknesses, are selected by controller 20 from values stored in memory 50. Additional geometrical parameters, such as resist pattern, resist linewidth, and resist sidewall profiles (both symmetrical and asymmetrical) are similarly selected. Controller 20 computes reference overlay images for the combinations of the material and geometrical parameters of patterned resist 12 on the known semiconductor stack of wafer 46 for multiple wavelengths of illumination and multiple focal settings, using calculation methods and computational tools that are known in the art. Controller 20 stores the computed reference overlay images in memory 50.

Controller 20 computes spectral properties for the reference overlay images. The computed spectral properties comprise, for example, the dependence of image contrast on wavelength, the variance of image amplitudes across a spectrum, the variance of image asymmetry across a spectrum, and the variance of above-described overlay shift across a spectrum.

After this library has been prepared, overlay images are captured by detector array 34 of optical inspection apparatus 10 for multiple discrete wavelengths of illumination emitted by illumination assembly 16. Controller 20 processes the captured overlay images in order to measure spectral properties corresponding to those computed from reference overlay images. The controller searches for the best match between the measured spectral properties and computed spectral properties, and assigns the complex refractive index associated with the best-matching computed spectral property to each location on patterned photoresist 12, i.e., at each pixel that is evaluated.

The use of a single spectral property may lead to a multivalued result for the complex refractive index, for example, when different combinations of geometrical properties of a patterned photoresist feature yield close matches between the corresponding spectral properties and the measured spectral property. In such a case, a combination of multiple spectral properties may be used to break the tie and to arrive to a single agreed-upon value of the complex refractive index, as well as to increase the confidence level for the obtained result.

Although the embodiments described above use specific types of images and signals, such as interferometric and overlay images, in measuring spectral properties, other imaging and measurement techniques that are known in the art may similarly be used in the context of the methods described above for computing complex refractive indices. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for optical inspection, comprising:
    illuminating a patterned polymer layer on a semiconductor wafer with optical radiation over a range of infrared wavelengths;
    measuring spectral properties of the optical radiation reflected from multiple points on the patterned polymer layer over the range of infrared wavelengths; and
    based on the measured spectral properties, computing a complex refractive index of the patterned polymer layer.

2. The method according to claim 1, wherein measuring the spectral properties comprises recording interferometric signals from the multiple points on the patterned polymer layer.

3. The method according to claim 2, wherein measuring the spectral properties comprises computing a reflectance spectrum of each of the multiple points on the patterned polymer layer by applying a Fourier transform to the recorded interferometric signals.

4. The method according to claim 1, wherein computing the complex refractive index comprises:

computing a reference library of computed reflectance spectra using multiple values of the complex refractive index and properties of the patterned polymer layer and the semiconductor wafer;

selecting from the reference library a computed reflectance spectrum that best matches the measured spectral properties; and assigning to the patterned polymer layer the complex refractive index of the selected computed spectrum.

5. The method according to claim 4, wherein computing the reference library comprises computing the reflectance spectra using an optical thin-film computational model.

6. The method according to claim 4, wherein selecting the computed reference spectrum comprises computing a root-mean square difference between the measured spectral properties and each of the computed reflectance spectra.

7. The method according to claim 1, wherein computing the complex refractive index comprises computing the complex refractive index of the patterned polymer layer at each of the multiple points on the patterned polymer layer, and computing an average and a standard deviation of the computed complex refractive index over the multiple points.

8. The method according to claim 1, wherein the polymer layer comprises a photoresist.

9. The method according to claim 1, wherein measuring the spectral properties comprises capturing overlay images comprising the patterned polymer layer, and extracting the spectral properties from the overlay images.

10. An optical inspection apparatus comprising:

an illumination assembly, configured to illuminate a patterned polymer layer on a semiconductor wafer with optical radiation over a range of infrared wavelengths;

a detector array;

an imaging assembly configured to image the optical radiation reflected from multiple points on the patterned polymer layer onto the detector array; and a controller configured to read out and process signals from the detector array in response to the reflected radiation so as to measure spectral properties of the radiation reflected from the multiple points, and based on the measured spectral properties, to compute a complex refractive index of the patterned polymer layer.

11. The apparatus according to claim 10, wherein the imaging assembly is configured as an optical interferometer, and the controller is configured to read out and process interferometric signals from the detector array with respect to the multiple points on the patterned polymer layer.

12. The apparatus according to claim 11, wherein the controller is configured to compute a reflectance spectrum of each of the multiple points on the patterned polymer layer by applying a Fourier transform to the interferometric signals.

13. The apparatus according to claim 10, wherein the controller is configured to compute a reference library of computed reflectance spectra using multiple values of the complex refractive index and properties of the patterned polymer layer and the semiconductor wafer, to select from the reference library a computed reflectance spectrum that best matches the measured spectral properties, and to assign to the patterned polymer layer the complex refractive index of the selected computed spectrum.

14. The apparatus according to claim 13, wherein the controller is configured to compute the reflectance spectra using an optical thin-film model.

15. The apparatus according to claim 13, wherein the controller is configured to select the computed reflectance spectra by computing a root-mean square difference between the measured spectral properties and each of the computed reflectance spectra.

16. The apparatus according to claim 10, wherein the controller is configured to compute the complex refractive index of the patterned polymer layer at each of the multiple points on the patterned polymer layer and to compute an average and a standard deviation of the computed complex refractive index over the points.

17. The apparatus according to claim 10, wherein the polymer layer comprises a photoresist.

18. The apparatus according to claim 10, wherein the imaging assembly is configured to capture overlay images comprising the patterned polymer layer, and wherein the controller is configured to extract the spectral properties from the overlay images.

* * * * *